United States Patent [19]

Obara

[11] Patent Number: 4,814,689
[45] Date of Patent: Mar. 21, 1989

[54] METHOD OF MEASURING A CABLE DELAY TIME

[75] Inventor: Hideyuki Obara, Tokyo, Japan

[73] Assignee: Fujitsu Limited, Kawasaki, Japan

[21] Appl. No.: 941,369

[22] Filed: Dec. 15, 1986

[30] Foreign Application Priority Data

Dec. 16, 1985 [JP] Japan .................................. 60-284133

[51] Int. Cl.$^4$ ............................................ G01N 22/00
[52] U.S. Cl. ............................ 324/58.5 B; 324/58.5 B
[58] Field of Search .................. 324/58 B, 58.5 B, 532, 324/533, 534, 535, 58 R, 58.5 R; 73/5

[56] References Cited

U.S. PATENT DOCUMENTS

| 3,590,368 | 6/1971 | Esciangon | 324/532 X |
| 3,796,948 | 3/1974 | Wentworth | 324/58 B |
| 3,911,358 | 10/1975 | Shalyte et al. | 324/532 X |
| 3,991,364 | 11/1976 | Wiznerowicz | 324/534 X |
| 4,041,381 | 8/1977 | Hwa | 324/553 |
| 4,598,575 | 7/1986 | Wilke | 73/5 |
| 4,734,637 | 3/1988 | Chen et al. | 324/58 R |

FOREIGN PATENT DOCUMENTS 0074806 3/1983 European Pat. Off.
2216587 8/1974 France.
635439 11/1978 U.S.S.R.

OTHER PUBLICATIONS

Wiltron Co., "Automated Scalar Network Analyzer", Microwave Journal, vol. 23, No. 10 (10-80), pp. 81-82.
"Measurement of Delay Coaxial Cables", Instruments and Experiments, vol. 20, No. 4/2, Jul./Aug., 1977, pp. 1118-1120, Ryazanov European Search Report, The Hague, Examiner: Trelevan C., 03/23/87.
"Simplified Instrumentation Setup Measures Prop Delays in PSECS", E.D.N. Elec. Design News, vol. 28, No. 18, Sep. 1, 1983, pp. 127-130, W. Wilke, Boston, Mass.

Primary Examiner—Reinhard J. Eisenzopf
Assistant Examiner—Robert W. Mueller
Attorney, Agent, or Firm—Staas & Halsey

[57] ABSTRACT

In a method of measuring a cable delay time by using an oscilloscope, a pulse generator, and a frequency counter, a period of a pulse signal is adjusted so that a leading edge of the pulse signal coincides with that of a reflected wave of the pulse signal, and the cable delay time is calculated by the period of the pulse signal. Therefore, an accurate measurement can be achieved with a simple operation.

3 Claims, 6 Drawing Sheets

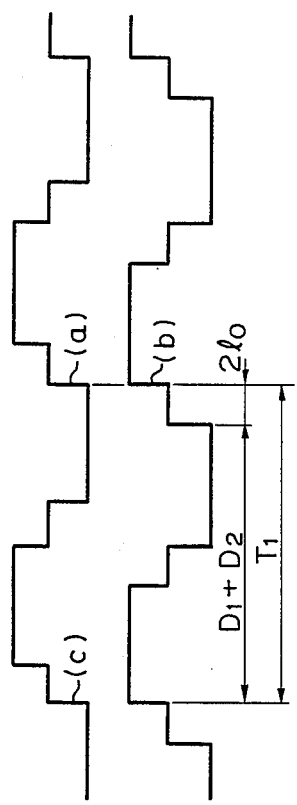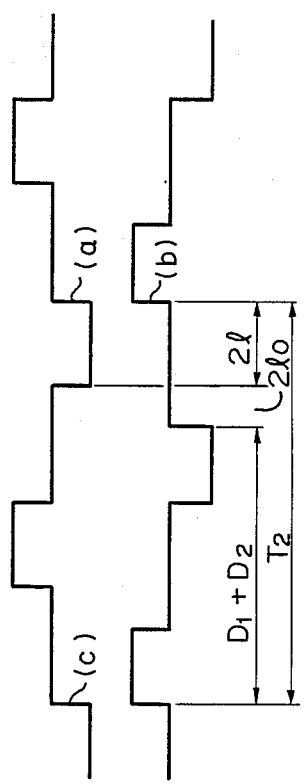
Fig. 2A
Fig. 2B
Fig. 3A
Fig. 3B

METHOD OF MEASURING A CABLE DELAY TIME

BACKGROUND OF THE INVENTION

1. Field of the Invention

The present invention relates to a method of measuring a cable delay time.

2. Description of the Related Arts

In data processing systems for high-speed processing, a central processing unit (CPU) in particular, is constituted by high-density semiconductor IC elements. Signals between these elements are weak, and coaxial cables are used to prevent noise mixing.

The delay time of the signal transmission through the connection cables greatly influences the processing times or phases of various signals, and since cables having the same length may have different delay times, the delay times of the respective cables must be measured.

A demand has arisen for a method of easily and accurately measuring the delay times of connection cables when the connection cables are prepared.

One conventional method of measuring a cable delay time is practiced as follows. One end of a cable to be measured is connected to a pulse genertor, probes of a conventional sampling scope (referred to hereinafter as an oscilloscope) are connected respectively to both ends of the cable, and a time difference between the pulse waves from the probes is directly read on the screen of the oscilloscope.

Another conventional method of measuring a cable delay time is practiced as follows. One end of a cable to be measured is connected to a pulse generator, and the other end of the cable is kept open. The probes are connected to the pulse generator to read a time difference between the transmitted waveform of the pulse signal and the waveform reflected by the cable end, and half of that difference is measured to obtain the cable delay time.

According to these conventional methods, the two waveforms on the screen of the oscilloscope must be read with reference to the scale thereon, and large reading errors tend to occur. In particular, if the delay time is increased, the measuring range must be changed, thus further increasing the possibility of errors.

According to the first method described above, the cable must be measured after a characteristic impedance is connected to theend of the cable, and it is cumbersome to connect the characteristic impedance element to or disconnect it from the cable for every measurement.

SUMMARY OF THE INVENTION

The present invention has been made in consideration of the above situation, and an object thereof is to provide a method of measuring a cable delay time by utilizing a zero point measurement scheme wherein a period of a pulse signal from a pulse generator is changed in such a way that waveforms of a transmission pulse signal and a reflected signal of the transmitted pulse signal coincide with each other, thereby measuring the cable delay time.

To achieve the above-mentioned object, a method of measuring a cable delay time according to the present invention is characterized in that a measuring circuit is used which is arranged in such a way that two probes of an oscilloscope are connected to two positions of an auxiliary cable connected to a pulse generator, one end of a cable to be measured is connected to the other end of the auxiliary cable, and a delay element is connected between one of the probes and the oscilloscope. A period T1 of a pulse signal generated from the pulse generator in such a manner that a leading edge of the pulse signal coincides with a leading edge of a reflected wave signal of the pulse signal is measured when the cable is not connected, a period T2 of the pulse signal generated in such a manner that the leading edges of the pulse signal and the reflected wave signal coincide with each other is measured when the cable is connected, and a calculation $(T2-T1)/2$ is performed to obtain a delay time of the cable.

Further features and advantages of the present invention will be apparent from the ensuing description with reference to the accompanying drawings to which, however, the scope of the invention is in no way limited.

BRIEF DESCRIPTION OF THE DRAWINGS

FIGS. 2A and 2B are timing charts of waveforms when the cable to be measured is not connected to the measuring circuit;

FIGS. 3A and 3B are timing charts of waveforms when the cable to be measured is connected to the measuring circuit;

DESCRIPTION OF THE PREFERRED EMBODIMENTS

Figure 1:
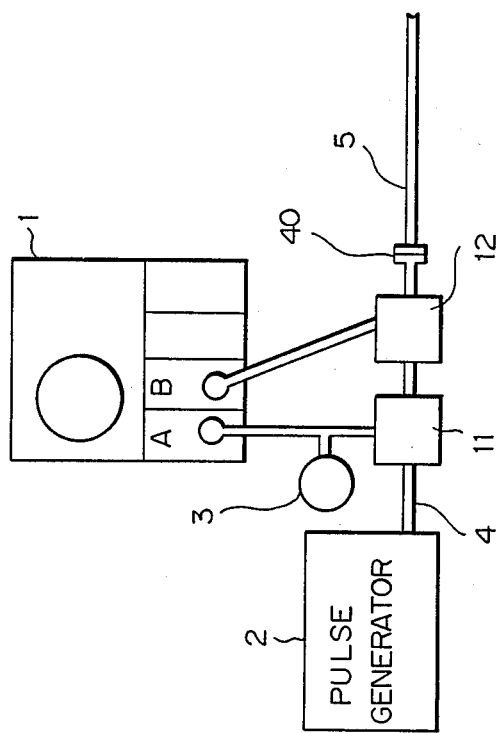
FIG. 1 is a schematic view showing the principle of the measuring circuit according to the present invention.

FIG. 1 is a schematic diagram showing the principle of a measuring circuit for practicing a method of measuring a cable delay time according to the present invention. In FIG. 1, reference numeral 1 denotes an oscilloscope; 2, a pulse generator; 3, a delay element; 4, an auxiliary cable; 5, a cable to be measured; 11, an A-channel probe; and 12, a B-channel probe. The auxiliary cable 4 is connected to the output terminal of the pulse generator 2, and the A- and B-channel probes 11 and 12 are respectively connected to the cable 4 from the side of the pulse generator 2. The cable 5 is connected to a connector 40 at the other end of the auxiliary cable 4.

The delay element 3 is inserted between the oscilloscope 1 and the A-channel probe 11.

First, the cable to be measured is not connected to the measuring connector 40, and the measuring circuit is set.

FIGS. 2A and 2B are timing charts of waveforms displayed on the screen of the oscilloscope 1. FIG. 2A shows the waveform from the A-channel probe 11, and FIG. 2B shows the waveform from the B-channel probe 12.

The waveforms are stepwise waveforms obtained by superimposing the waveform reflected by the open end of the cable 5 on the waveform of the pulse signal from the pulse generator 2.

A period T1 of the pulse generator 2 is changed in such a way that a leading edge (a) of the signal waveform of the A-channel waveform coincides with a leading edge (b) of the reflected waveform of the B-channel waveform. A period T1 at the time of a coincidence between the leading edges (a) and (b) is measured.

Then, after the cable 5 is connected to the connector 40, a period T2 of the pulse generator 2 at the time when the leading edges (a) and (b) coincide with each other (FIGS. 3A and 3B) is measured in the same way.

A delay time l of the measured cable is calculated by the resultant periods T1 and T2, as follows:

$$l = (T2 - T1)2$$

When the delay element 3 is inserted in the measuring circuit, the waveform of the A-channel probe 11 is displayed with a delay time D1. Assume that a delay time of the auxiliary cable 4 between the A- and B-channel probes 11 and 12 is defined as D2, and that a delay time between the B-channel probe 12 and the measuring connector 40 is defined as lO. If the time bases in FIGS. 2A and 2B are matched, the actual A-channel waveform on the screen appears to advance by one wave from the B-channel waveform. The actual waveform coincident points are (c) and (b).

The period T1 is given as $$T1 = D1 + D2 + 2lO$$

Similarly, if a delay time of the measured cable is given as l, the period T2 measured while the cable 5 is connected is defined as follows:

$$T2 = D1 + D2 + 2lO + 2l$$

Therefore, the delay time l of the measured cable 5 is calculated as follows:

$$l = (T2 - T1)/2$$

Figure 4:
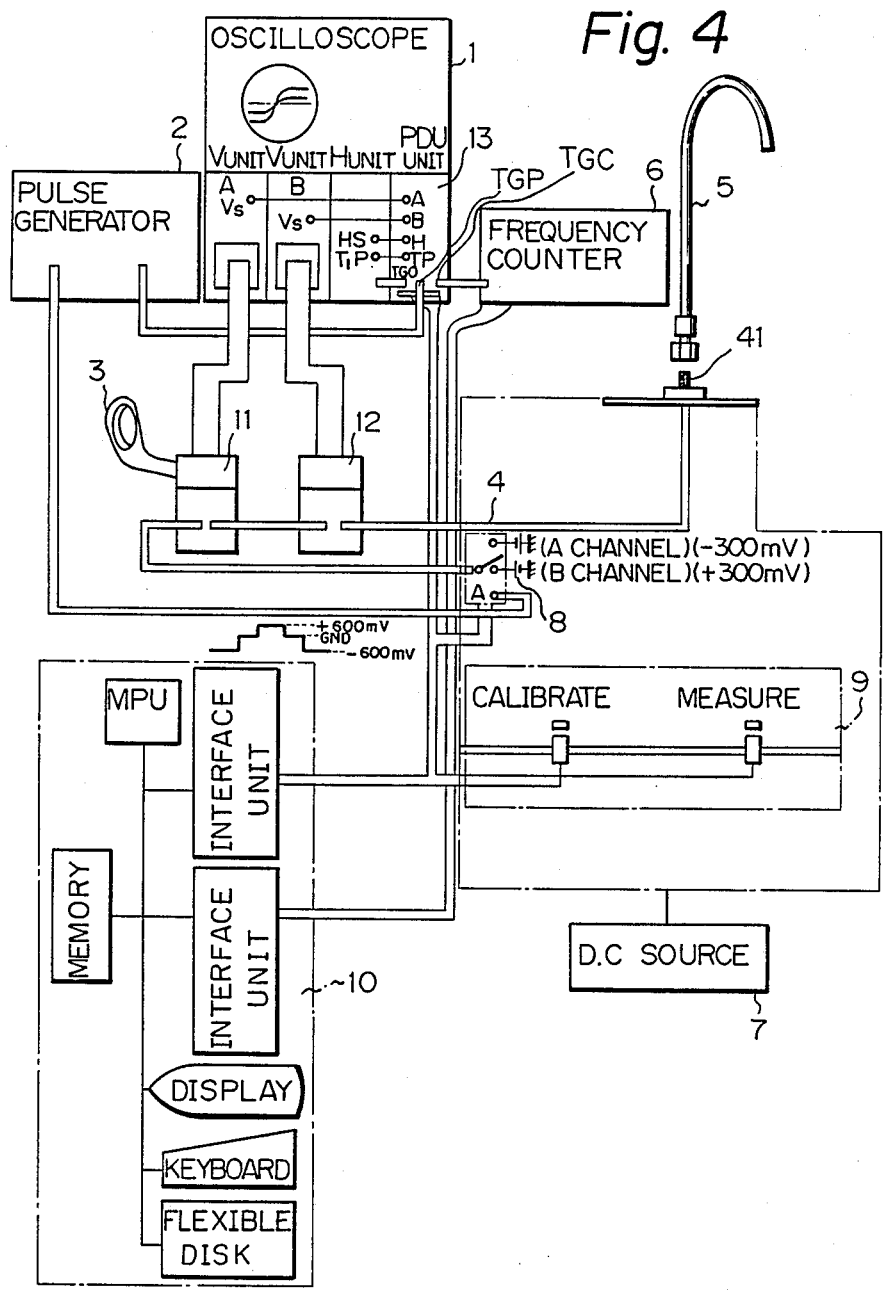
FIG. 4 is a schematic diagram of a measuring circuit according to an embodiment of the present invention.

FIG. 4 shows an arrangement of a measurement circuit for practicing a method of measuring a cable delay time according to the present invention.

The same reference numerals denote the same parts throughout the drawings.

In the embodiment shown in FIG. 4, a 7904A sampling oscilloscope manufactured by Tektronix Inc. is used as the oscilloscope 1, a 7S11 type unit is used for the vertical units A and B, a 7T11 type unit is used for the horizontal (time base) unit, and an S6 unit is used as the A-channel probe 11 and the B-channel probe.

The period of a pulse generator 2 is adjusted by a frequency adjustment unit 13 in an oscilloscope 1 and is measured by a frequency counter 6 (period = 1/frequency).

The function of the frequency adjustment unit 13 is to allow the two waveforms displayed on the screen of the oscilloscope to coincide, i.e., the function of automatically adjusting the period of the pulse generator 2.

Reference numeral 7 denotes a power source for supplying a voltage of a DC measuring level, and 8 denotes a coaxial relay. The relay 8 sets the positions of the waveforms upon switching of the DC measuring level of the A and B channels of the oscilloscope 1 during calibration, and connects the pulse generator 2 and the auxiliary cable 4 during measurement.

Reference numeral 9 denotes a measurement/calibration state setting switch for the measuring circuit, and 10 denotes a microcomputer for controlling the measuring circuit and acquiring the measured data.

The delay element 3 delays a sampled signal of the A-channel probe. The length of the cable to be measured is doubled, and this cable is connected to the delay element 3 so as to allow a double delay time of the delay time to be measured.

Insertion of the delay element 3 in the measuring circuit allows the A-channel waveform to advance relative to the B-channel waveform on the screen.

Figure 5:
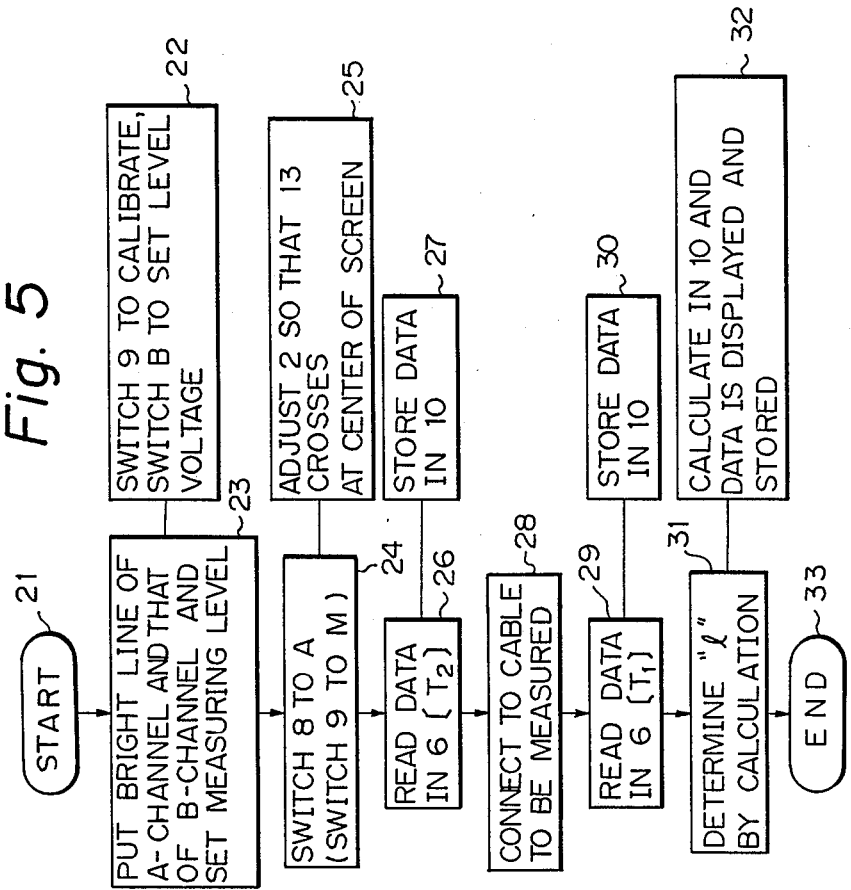
FIG. 5 is a flow chart for explaining the operation of the embodiment in FIG. 4.

As shown in blocks 22 and 23 of the flow chart of FIG. 5, the cable 5 is not connected to the measuring circuit, and the setting switch 9 is switched to the "calibration" position to set the emission line positions of the A and B channels.

Figure 6:
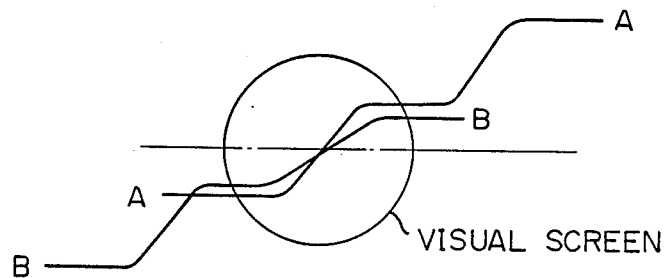
FIG. 6 is a view showing the screen of the oscilloscope.

The positional relationship between these waveforms is set as shown in FIG. 6.

The setting switch 9 is then switched to the "measurement" position, and the coaxial relay 8 is set at the "A" position to set the measurement mode, as shown in block 24 of the flow chart. The frequency adjustment unit 13 automatically adjusts the period of the pulse generator 2 such that both waveforms cross at the center of the screen, as shown in block 25.

At this time, the period T2 of the frequency counter 6 is read by the microcomputer 10 and is stored in, e.g., a flexible disk in the microcomputer 10, as shown in blocks 26 and 27.

Subsequently, the cable 5 is connected to the measuring connector 40 to read the period T1 of the frequency counter 6 in the same manner as described above (block 28 and 29). The period T1 is then stored in the flexible disk for the microcomputer 10 (block 30).

When the periods T1 and T2 are measured, the microcomputer 10 calculates the delay time l of the measured cable according to the equation described above (block 31). At the same time, the calculated delay time l is stored in the flexible disk, and the associated data is displayed on the display (block 32).

The intersection between the waveforms displayed on the oscilloscope screen is adjusted to be at the central position, as shown in FIG. 6. Therefore, the screen scale units can be increased to improve measurement precision.

Figure 7:
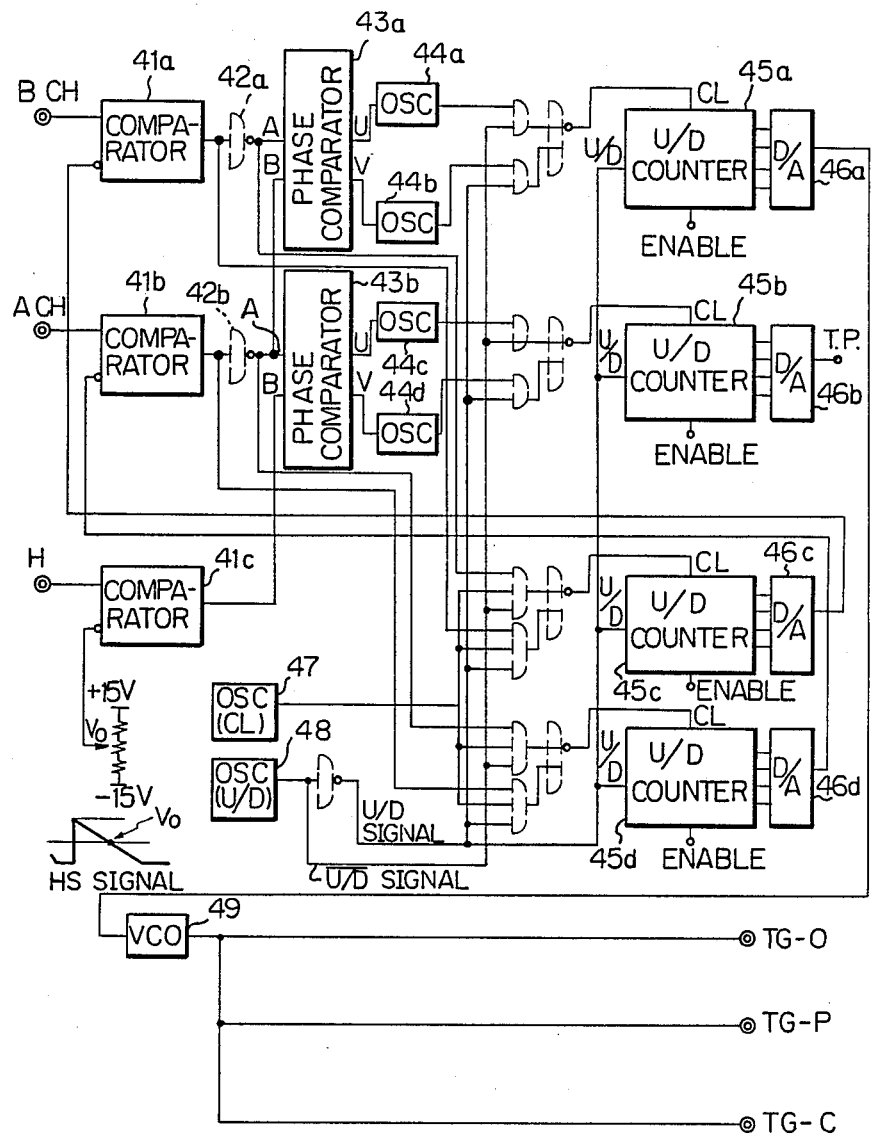
FIG. 7 is a block diagram of a frequency adjusting unit shown in FIG. 4.

FIG. 7 is a block diagram of the frequency adjustment unit 13 shown in FIG. 4. The frequency adjustment unit has the following functions; i.e., to set an A channel measuring level, to set a B channel measuring level, to position an edge of an A channel waveform at a center position of a screen, and to adjust the period so that the edges of the A and B channel waveforms are crossed.

(a) Setting of A channel measuring level

When the DC source 9 (FIG. 5) having an A channel measuring level (for example, −300 mV) is connected to a measuring system, the corresponding to that level is supplied to the A channel terminal and is input to a comparator 41b in FIG. 7. Another input of the comparator 41b is connected to the output of a D/A converter 46d. When the output of the D/A converter 46d is lower than the A channel measuring level, the comparator 41b output is "1" level, a U/D terminal of a U/D counter 45d receives the "1" level output and a CL terminal of a U/D counter 45d receives a clock. Then, the U/D counter 45d is counted up so that the voltage of the D/A converter 46d rises. This operation is carried out until the output of the D/A converter 46d becomes equal to the A channel measuring level.

When the output of the D/A converter 46d is higher than the A channel measuring level, the output of the comparator 41b becomes a "0" level, the output of an inverter 42b becomes "1" level. The U/D terminal of the U/D counter 45d receives "0" level and CL terminal of the U/D counter 45d receives a clock. The U/D counter 45d is then counted down, and the output of the D/A converter 46d is lowered. This operation is carried out until this output becomes equal to the A channel measuring level.

When the output voltage of the D/A converter 46d and the A channel measuring level become equal, the operation of the U/D counter 46d is stopped by an enable signal supplied thereto, and thus the voltage correspondig to the A channel measuring level ($-300$ mV) can be stored with a high accuracy.

(b) Setting of B channel measuring level

This is carried out in the same way as for the A channel measuring level mentioned in item (a) above, except that, $+300$ mV is used as the voltage connected to the measuring system, and a comparator 41a, an U/D counter 45c, and a D/A converter 46c are operated.

(c) Positioning an edge of the A-channel waveform at the center of the screen

The coaxial relay 8 shown in FIG. 4 is switched to a position A, so that the waveform in the pulse generator 2 is passed through the A channel probe 11 and the B channel probe 12. A sawtooth wave (sweep wave) in a time base unit of the oscilloscope 1 is connected via a terminal H in FIG. 7 to a comparator 41c. Another input of the comparator 41c is set to a voltage valve V0 of a center portion of the sawtooth wave, that is, a center of the screen of the oscilloscope.

An input of the comparator 41b receives a waveform corresponding to the pulse generator, and the other input thereof receives a measuring level set as in item (b) above. Therefore, the output of the comparator 41b is operated so that the measuring level ($-300$ mV) is used as a threshold voltage, and the comparator 41c is operated so that the voltage V0 corresponding to a center of the screen is the same as the threshold voltage.

Figure 8A:
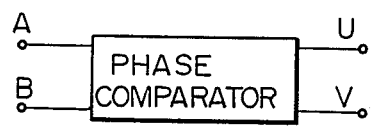
FIG. 8A shows a phase comparator unit shown in FIG. 7 and FIGS. 8B and 8C show waveforms in the comparator unit shown in FIG. 8A.
Figure 8B:
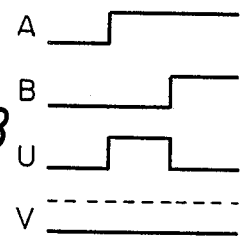
Figure 8C:
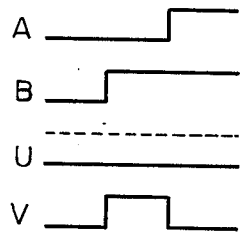

The outputs of the comparator 41b and the comparator 41c are supplied to inputs of a phase comparator 43b. The phase comparator 43b operates as shown in FIGS. 8A, 8B, and 8C. That is, the phase comparator 43b causes either an oscillator 44c or an oscillator 44b to oscillate during the time difference between the two phases A and B, and a U/D counter 45b is operated by using this oscillation as a clock. This U/D counter 45b distinguishes whether the clock is from the oscillator 44c or 44d by an oscillator 47 for U/D use. Accordingly, the output voltage of the D/A converter 46b is changed, and a voltage at the output termial TP is changed, so that the A channel waveform is placed at the center of the screen. The T.P. signal at the output terminal is connected to a T.P. terminal of the H unit of the oscilloscope 1 so that the position on the screen varies linearly.

(d) Adjusting the period so that the edges of A and B channel waveforms are crossed The coaxial relay 8 shown in FIG. 4 is switched to a position A, so that the waveform in the pulse generator 2 is passed through the A channel probe 11 and the B channel probe 12. An input of the comparator 41b receives the waveform corresponding to the pulse generator 2 and the other input is set as the measuring level set in item (a) mentioned above. An input of the comparator 41a receives the waveform corresponding to the pulse generator 2, and the other input thereof is set as the measuring level set in item (b) mentioned above.

Therefore, the output of the comparator 41a is operated by using the measuring level ($+300$ mV) as a threshold voltage, and the output of the comparator 41b is operated by using the measuring level ($-300$ mV) as a threshold voltage.

The outputs of the comparator 41a and the comparator 41b are supplied to inputs of a phase comparator 43a. The phase comparator 43a operates as shown in FIGS. 8A, 8B, and 8C. That is, the phase comparator causes either an oscillator 44a or an oscillator 44b to oscillate during the time difference between two phases. A U/D counter 45a is operated by using the above oscillation as a clock. This U/D counter 45a distinguishes whether the clock is from the oscillator 44a or 44b by an oscillator 47 for U/D use. Accordingly, the output voltage of the D/A converter 46a is changed. This voltage is connected to a voltage terminal of a voltage controlled oscillator 49 in which an oscillation voltage is changed. This voltage controlled oscillator shapes the waveform in the pulse generator 2, and the level thereof is determined and input to the A channel probe and the B channel probe.

The frequency in the voltage controlled oscillator 49 changes until the time the waveforms of A channel and the B channel cross.

According to the present invention as described above, the delay time of the cable to be measured can be accurately measured with simple operations, thus providing practical advantages.

I claim:

1. A method of measuring a cable delay time, comprising the steps of:
   (a) connecting a measuring circuit including two probes from an oscilloscope connected at two positions along an auxiliary cable having a first end connected to a pulse generator and a second end connected to a first end of a cable to be measured with a delay element connected between one of the probes and the oscilloscope;
   (b) generating a first pulse signal with a first period using the pulse generator when the cable to be measured is not connected, the first period being selected so that a leading edge of the first pulse signal coincides with a leading edge of a first reflected wave signal of the first pulse signal reflected from the second end of the auxiliary cable;
   (c) generating a second pulse signal with a second period when the cable to be measured is connected, the second period being selected so that leading edges of the second pulse signal and a second reflected wave signal, reflected from a second end of the cable to be measured, coincide with each other; and
   (d) calculating the cable delay time as one-half the difference between the first and second periods.

2. A method of measuring a cable delay time according to claim 1, wherein step (a) comprises connecting a delay cable having a length two times that of the cable to be measured as the delay element.

3. A method of measuring a cable delay time according to claim 1, further comprising the steps of:
- (e) connecting a frequency adjustment unit to the pulse generator and to the oscilloscope to receive signals from the two probes and connecting a frequency counter and a microcomputer to the measuring circuit and a relay between the auxiliary cable and the pulse generator;
- (f) automatically adjusting the frequency of the first and second pulse signals using the frequency adjustment unit under the control of the microcomputer to select the first and second periods;
- (g) calibrating the probes prior to measurement to obtain coincident measuring levels of the two probes by controlling the relay connected in the measuring circuit, wherein step (b) comprises the steps of:
- (bi) controlling the relay to connect the pulse generator to the auxiliary cable;
- (bii) controlling the frequency adjustment unit to obtain the first pulse signal from the pulse generator;
- (biii) measuring the first period using the frequency counter; and
- (biv) storing the first period in the microcomputer, wherein step (c) comprises the steps of:
- (ci) connecting the first end of the cable to be measured to the second end of the auxiliary cable;
- (cii) controlling the frequency adjustment unit to obtain the second pulse signal from the pulse generator;
- (ciii) measuring the second period using the frequency counter; and
- (civ) storing the second period in the microcomputer, and wherein step (d) comprises the steps of:
- (di) subtracting the first period from the second period to obtain the difference between the first and second periods;
- (dii) multiplying the difference between the first and second periods by one-half to obtain the cable delay time; and
- (diii) displaying the cable delay time using the microcomputer.

* * * * *

UNITED STATES PATENT AND TRADEMARK OFFICE
CERTIFICATE OF CORRECTION

PATENT NO. : 4,814,689

DATED : March 21, 1989

INVENTOR(S) : Obara

It is certified that error appears in the above-identified patent and that said Letters Patent is hereby corrected as shown below:

Col. 1, line 48, "theend" should be --the end--.

Col. 3, line 15, "1" should be --$\ell$--;

line 18, "1=" should be --$\ell =$ --;

line 26, "10." should be --$\ell$0.--;

line 32, "+210" should be --+2$\ell$0--;

line 35, "1," should be --$\ell$,--;

line 38, "+210+21" should be --+2$\ell$0 + 2$\ell$--;

line 40, "1" should be --$\ell$--;

line 43, "1=" should be --$\ell$= --.

Col. 4, line 40, "1" should be --$\ell$--;

line 43, "1" should be --$\ell$--.

Signed and Sealed this

Seventh Day of November, 1989

Attest:

JEFFREY M. SAMUELS

Attesting Officer  Acting Commissioner of Patents and Trademarks